United States Patent
Takata

(10) Patent No.: US 7,982,847 B2
(45) Date of Patent: Jul. 19, 2011

(54) DISPLAY DEVICE AND A TELEVISION RECEIVER HAVING THE SAME

(75) Inventor: Yoshiki Takata, Suzuka (JP)

(73) Assignee: Sharp Kabushiki Kaisha, Osaka (JP)

( * ) Notice: Subject to any disclaimer, the term of this patent is extended or adjusted under 35 U.S.C. 154(b) by 275 days.

(21) Appl. No.: 11/908,617

(22) PCT Filed: Feb. 17, 2006

(86) PCT No.: PCT/JP2006/302804
§ 371 (c)(1),
(2), (4) Date: Sep. 14, 2007

(87) PCT Pub. No.: WO2006/098114
PCT Pub. Date: Sep. 21, 2006

(65) Prior Publication Data
US 2009/0231506 A1    Sep. 17, 2009

(30) Foreign Application Priority Data

Mar. 15, 2005 (JP) ................................ 2005-072169

(51) Int. Cl.
*G02F 1/1333* (2006.01)
*H01K 1/58* (2006.01)
(52) U.S. Cl. .......................................... 349/161; 313/46
(58) Field of Classification Search .................. 349/161; 313/46
See application file for complete search history.

(56) References Cited

U.S. PATENT DOCUMENTS

| | | | | |
|---|---|---|---|---|
| 5,221,575 A | * | 6/1993 | Nakano et al. | 428/323 |
| 5,428,190 A | * | 6/1995 | Stopperan | 174/261 |
| 6,926,861 B2 | * | 8/2005 | Hirayama et al. | 419/49 |
| 7,009,284 B2 | * | 3/2006 | Nakase et al. | 257/675 |
| 7,187,913 B1 | * | 3/2007 | Rahn et al. | 455/188.1 |
| 2002/0126078 A1 | | 9/2002 | Horibe et al. | |

FOREIGN PATENT DOCUMENTS

| | | |
|---|---|---|
| JP | 05-241148 A | 9/1993 |
| JP | 2000-275622 A | 10/2000 |
| JP | 2002-189252 A | 7/2002 |
| JP | 2002-277870 A | 9/2002 |
| JP | 2004-053786 A | 2/2004 |
| JP | 2005-024810 A | 1/2005 |
| JP | 2005-25111 A | 1/2005 |
| JP | 2005-150429 A | 6/2005 |
| JP | 2005150429 A * | 6/2005 |
| KR | 20050120151 A1 * | 12/2005 |

OTHER PUBLICATIONS

Official communication issued in the International Application No. PCT/JP2006/302804, mailed Mar. 14, 2006.

* cited by examiner

*Primary Examiner* — Mark A Robinson
*Assistant Examiner* — Erin D Chiem
(74) *Attorney, Agent, or Firm* — Keating & Bennett, LLP

(57) ABSTRACT

A display device is capable of efficiently cooling electronic or electrical components disposed therein without installing a cooling element or member on the electronic or electrical components. In the display device, a ceramic or ceramic-containing layer is formed on any one of a surface of a member placed in proximity to the electronic or electrical component, the surface facing at least the electronic or electrical component, a surface of the member placed in proximity to the electronic or electrical component, the surface opposite to the surface facing the electronic or electrical component, a surface of the electronic or electrical component, and a surface of a circuit board, the surface opposite to a surface of the circuit board on which the electronic or electrical component is mounted.

8 Claims, 4 Drawing Sheets

DISPLAY DEVICE AND A TELEVISION RECEIVER HAVING THE SAME

BACKGROUND OF THE INVENTION

1. Field of the Invention

The present invention relates to a display device such as a liquid crystal display device and a television receiver having the same, and more specifically relates to a display device having a cooling mechanism arranged to cool electronic or electrical components disposed inside the display device and a television receiver having the same.

2. Description of the Related Art

A generally used translucent liquid crystal display device, which is cited as an example of display devices, includes a liquid crystal panel arranged to display an image and a lamp as a light source disposed behind the liquid crystal panel. Light emitted from the lamp passes through the liquid crystal panel, making an image displayed visible on a front side of the liquid crystal panel.

On a peripheral portion of the liquid crystal panel, TABs on which source driver ICs, gate driver ICs and the like are mounted and a printed circuit board on which other electronic or electrical components are mounted are installed. Each of pixels formed by the source driver ICs and the gate driver ICs on the liquid crystal panel is applied with voltage to control directions of liquid crystal molecules. A control circuit board that controls the source driver ICs and the gate driver ICs is disposed behind the lamp. An inverter circuit board that produces a high volt alternating current which is provided to the lamp is disposed also behind the lamp.

Electronic or electrical components included in the display device, for example, the source driver ICs, the gate driver ICs, and the electronic or electrical components mounted on the control circuit board and the inverter circuit board, generate heat during operation. Especially, the source driver ICs, a control IC mounted on the control circuit board, and a primary side transistor of an inverter circuit mounted on the inverter circuit board generate a large quantity of heat since a large current flows therethrough. In addition, these electronic or electrical components are covered with a metallic cover in view of the necessity of preventing the entry of dust particles from the outside of the display device or preventing the leakage of electromagnetic waves. Thus, the heat generated by the electronic or electrical components is apt to be accumulated thereabout.

In addition, recent increases in the size of the liquid makes the current flowing through the electronic or electrical components larger, thus making the quantity of generated heat larger. In order to maintain intended performance, the electronic or electrical components should be cooled.

As a configuration to cool the electronic or electrical components that generate a large quantity of heat, considered is a configuration to install a cooling element or member such as a radiating fin on the electronic or electrical components. However, in this configuration, the radiating fin should be brought into intimate contact with the electronic or electrical components in order to increase efficiency in cooling, and an excessive force is exerted on the electronic or electrical components. Thus, there is a possibility that the electronic or electrical components are apt to come off the circuit boards or a film.

As a configuration to cool the electronic or electrical components without the installation of the cooling element or member such as a radiating fin, proposed is a configuration to use a cooling fan (see Japanese Patent Application Unexamined Publication No. 2005-25111). In this configuration, the cooling fan is placed in proximity to a horizontal scanning driving circuit unit in order to cool the horizontal scanning driving circuit unit, so that performance deterioration due to the heat generation is prevented.

However, this configuration presents problems as described below. First, an electric motor provided to the cooling fan as a rotation driving source has a lifetime far shorter than the lifetime of the liquid crystal panel or the lamp, which presents a problem in view of the design of the display device. In addition, when the display device provided with the cooling fan is used in a television receiver or the like, a rotation sound made by the electric motor could be sometimes perceived as a noise by the user if the television receiver is used at a low sound level. Such a generation of noise is not preferable in view of the quality of the display device.

SUMMARY OF THE INVENTION

In order to overcome the problems described above, preferred embodiments of the present invention provide a display device having a cooling mechanism capable of efficiently cooling electronic or electrical components without using a cooling element or member, or a cooling fan that generates rotation sound, and also provide a display device having electronic or electrical components with a simple structure.

According to a preferred embodiment of the present invention, for a member of a display device that is placed in proximity to an electronic or electrical component which is a subject of cooling, a ceramic or ceramic-containing layer arranged to absorb heat radiated from the electronic or electrical component is formed on a surface of the member facing at least the electronic or electrical component.

It is preferable that a ceramic or ceramic-containing layer arranged to release the absorbed heat to the outside is formed on a surface of the member placed in proximity to the electronic or electrical component, the surface opposite to the surface of the member facing the electronic or electrical component.

It is preferable that the member placed in proximity to the electronic or electrical component is defined by a conductor, especially, a metallic material.

It is preferable that the member placed in proximity to the electronic or electrical component includes a cover adapted to cover the electronic or electrical component and a cover adapted to cover a circuit board on which the electronic or electrical component is mounted, for example, a control circuit board cover and a power supply board cover of a display element. In addition, it is preferable that the member placed in proximity to the electronic or electrical component includes a mechanical supporting member of the display device, for example, a frame and a bezel.

In addition, a ceramic or ceramic-containing layer arranged to radiate the heat generated by the electronic or electrical component may be formed also on a surface of the electronic or electrical component which is a subject of cooling.

It is preferable that a ceramic or ceramic-containing layer arranged to radiate the heat generated by the electronic or electrical component is also formed on a surface of the circuit board, the surface opposite to a surface on which the electronic or electrical component which is a subject of cooling is mounted.

In addition, the preferred embodiments of the present invention provide a television receiver which is made by incorporating the display device as described above.

In the member placed in proximity to the electronic or electrical component, when the ceramic or ceramic-containing layer is formed on the surface facing the electronic or electrical component, the heat radiated from the electronic or electrical component is absorbed by the ceramic or ceramic-containing layer. Since ceramic is a material that absorbs radiated heat well, when the ceramic or ceramic-containing layer is formed at a portion facing the electronic or electrical component, the electronic or electrical component can be efficiently cooled.

According to such a configuration, a problem of the difference in lifetime or a problem of rotation sound does not arise in contrast to a configuration in which a cooling fan is used. In comparison with the configuration in which a cooling element or member is installed on the electronic or electrical component, the configuration according to various preferred embodiments of the present invention eliminates the need of bringing the cooling element or member into contact with the electronic or electrical component, and the electronic or electrical component can be free of such attachments. Therefore, an excessive force is not exerted on the electronic or electrical component, and there is not a possibility that the electronic or electrical component comes off. In addition, since it is enough to provide the ceramic or ceramic-containing layer, the electronic or electrical component can be cooled with a cost effective and simple structure.

It is preferable that the member placed in proximity to the electronic or electrical component is defined by the conductor such as a metallic material in view of electromagnetic shielding of the electronic or electrical component. When the member placed in proximity to the electronic or electrical component is defined by the conductor, not only electromagnetic shielding of the electronic or electrical component but also shielding of the heat radiated from the electronic or electrical component are done, so that there is a possibility that releasing of the heat from the electronic or electrical component is hindered. However, the ceramic or ceramic-containing layer as mentioned above absorbs the heatradiated from the electronic or electrical component, so that the electronic or electrical component can be efficiently cooled while electromagnetic shielding of the electronic or electrical component is achieved. In particular, if the metallic material is used as the conductor, electromagnetic shielding can be made cost effectively and easily, and the ceramic or ceramic-containing layer can be formed easily.

In the member placed in proximity to the electronic or electrical component, when the ceramic or ceramic-containing layer is formed also on the surface opposite to the surface facing the electronic or electrical component, the heat absorbed by the ceramic or ceramic containing layer formed on the surface facing the electronic or electrical component is released to the outside (into the air) through the ceramic or ceramic-containing layer formed on the opposite surface. Since ceramic has a large interstice area, the same advantage as increasing an area of releasing heat is presented. In addition, since ceramic is a material having a property of easily radiating the heat contained therein to the outside, it releases heat well. According to the configuration as described above, there is provided a path of heat flow from the electronic or electrical component to the outside (into the air) through the ceramic or ceramic-containing layer formed on the surface facing the electronic or electrical component, and the ceramic or ceramic containing layer formed on the surface opposite to the surface facing the electronic or electrical component. Therefore, the heat generated by the electronic or electrical component can be efficiently released to the outside, and the electronic or electrical component can be effectively cooled.

Since the metallic material is a good conductor of heat, especially when the member placed in proximity to the electronic or electrical component is defined by the metallic material, the heat received by the ceramic or ceramic-containing layer formed on the surface of the member facing the electronic or electrical component can be easily conducted to the ceramic or ceramic-containing layer formed on the surface of the member opposite to the surface facing the electronic or electrical component and to other members installed on that member. Therefore, the efficiency in releasing the heat generated by the electronic or electrical component is further improved.

The control circuit board of the display element needs electrostatic shielding for EMI prevention and physical protection. In addition, the power supply board needs electromagnetic shielding since it generates high voltage noise. On the other hand, since the boards, especially the power supply board, have the electronic or electrical components mounted thereon, the electronic or electrical components should be cooled. Hence, by covering the boards with the covers made of the metallic material and forming the ceramic or ceramic-containing layers on the surfaces of the covers facing the electronic or electrical components and on their opposite surfaces, the electronic or electrical components mounted on the boards can be effectively cooled while EMI prevention, physical protection and electromagnetic shielding are achieved. In order to impart a property of electrostatic shielding the electronic or electrical components incorporated in the display device also to the mechanical supporting member including the frame and the bezel of the display device, the mechanical supporting member is sometimes made of the metallic material. In this case, by disposing the ceramic or ceramic-containing layer on the surface of the mechanical supporting member, the electronic or electrical component can be effectively cooled while the property of electrostatic shielding the electronic or electrical component covered by the mechanical supporting member is imparted.

When the ceramic or ceramic-containing layer is formed on the surface of the electronic or electrical component, the heat generated by the electronic or electrical component is radiated from the ceramic or ceramic-containing layer. Since the ceramic releases heat well as mentioned above, the electronic or electrical component can be effectively cooled.

In the boards or the film on which the electronic or electrical component is mounted, when the ceramic or ceramic-containing layer is formed also on the surface opposite to the surface on which the electronic or electrical component is mounted, the heat conducted from the electronic or electrical component to the boards or the film is radiated from the ceramic or ceramic-containing layer. Therefore, the electronic or electrical component can be cooled more effectively.

Other features, elements, steps, characteristics and advantages of the present invention will become more apparent from the following detailed description of preferred embodiments with reference to the attached drawings.

DETAILED DESCRIPTION OF PREFERRED EMBODIMENTS

A detailed description of preferred embodiments of the present invention will now be given with reference to the accompanying drawings. The preferred embodiments described below are preferably applied to a translucent liquid crystal display device.

Figure 1:
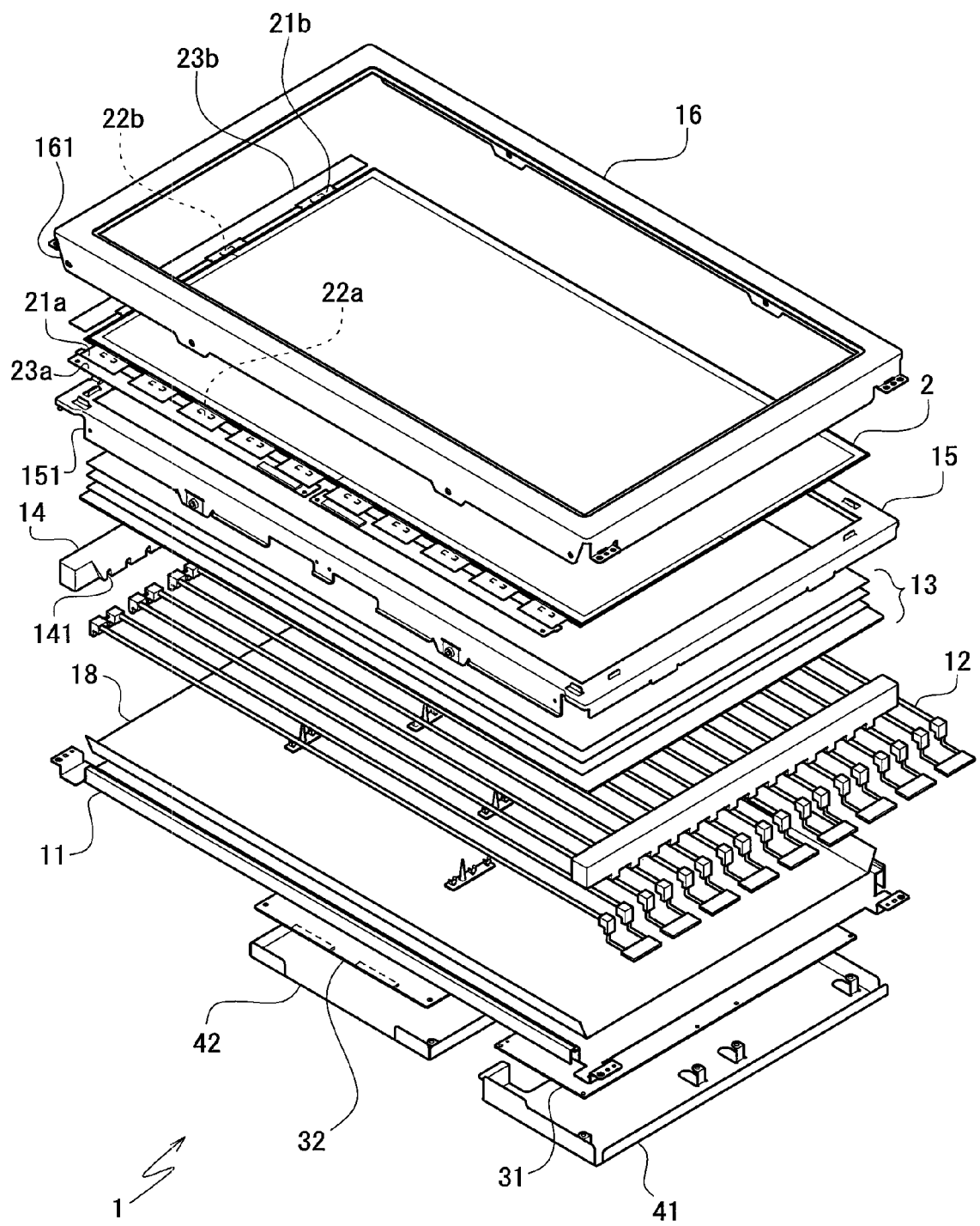
FIG. 1 is an exploded perspective view schematically illustrating a structure for assembling a display device according to a preferred embodiment of the present invention.

FIG. 1 is a view showing a structure of a display device according to a preferred embodiment of the present invention. Specifically, FIG. 1 is an exploded perspective view schematically illustrating a structure for assembling a translucent liquid crystal display device. In FIG. 1, the displace device is illustrated so that its front surface faces toward the top of FIG. 1, and its back surface faces toward the bottom of FIG. 1, based on which the following descriptions will be given.

First, a short summary of a configuration of the display device according to the present preferred embodiment of the present invention is given with reference to FIG. 1. A display device 1 includes lamps 12 as light sources, a reflection sheet 18 arranged to reflect light emitted from the lamps 12, optical sheets 13 arranged to control the properties of the light emitted from the lamps 12, a liquid crystal panel 2 arranged to transmit the light of which the properties have been controlled by the optical sheets 13 so as to make an image displayed visible. In addition, the display device 1 includes a backlight chassis 11, side holders 14 attached to shorter edges of the backlight chassis 11, and a frame 15 and a bezel 16 arranged to support the optical sheets 13 and the liquid crystal panel 2.

The display device 1 further includes an inverter circuit board 31 that generates high pulse voltage to drive the lamps 12, an inverter circuit board cover 41 arranged to cover the inverter circuit board 31, a control circuit board 32 that controls the liquid crystal panel 2, and a control circuit board cover 42 arranged to cover the control circuit board 32.

Next, the constituent members of the display device 1 according to a preferred embodiment of the present invention will be described.

The backlight chassis 11 is a member shaped like a plate, which is prepared by subjecting a metal plate material to press working.

The reflection sheet 18 is a member shaped like a sheet, which has surface properties of reflecting light diffusely. For the reflection sheet 18, an expanded PET (polyethylene terephthalate) material is preferably used, for example.

For the lamps 12, lamps of conventional type and structure used in display devices, for example, fluorescent tubes such as cold cathode tubes and hot cathode tubes as well as LEDs may be used. Hence, a description of the lamps 12 is omitted. In FIG. 1, an example of using linear fluorescent tubes is shown. The optical sheets 13 refer to a set of members in the shape of a plate or sheet, which are arranged to control the properties of the light emitted from the lamps 12. The optical sheets 13 are preferably defined by a stack of a diffusion plate, a lens sheet, and a diffusion sheet. Since conventional optical sheets can be used as the optical sheets 13, a detailed description thereof is omitted.

The side holders 14 are unitary molded members made of a synthetic resin and the like, which are substantially in the shape of a bar. Substantially U-shaped notches 141, which are freely fit to the ends of the lamps 12, are formed on a side surface of the side holder 14. For the side holders 14, conventional side holders can be used, and a description thereof is omitted.

The frame 15 and the bezel 16 are members preferably prepared by subjecting a metal plate material to press working. The frame 15 and the bezel 16 are substantially in the shape of a square with an opening, and side walls 151 and 161 are provided at the outer edges of the frame 15 and the bezel 16 so as to extend toward the back side. Thus, the four edges of the frame 15 and the four edges of the bezel 16 are substantially in the shape of a letter L in cross section. On a front surface at one of the longer edges of the frame 15 and an outer surface of the side wall 151 provided at the longer edge of the frame 15, ceramic or ceramic-containing layers (not shown) are formed. On a back surface at one of the longer edges of the bezel 16 and an inner surface of the side wall 161 provided at the longer edge of the bezel 16, ceramic or ceramic-containing layers (not shown) are formed.

The ceramic mentioned above preferably includes a sintered body of fine particles of alumina or magnesium oxide as well as a material for the sintered body, i.e., alumina or magnesium oxide in itself. A method for forming the ceramic or ceramic-containing layers includes coating or application of a coating material containing ceramic. However, the method according to the present invention is not specifically limited.

For the liquid crystal panel 2, a translucent liquid crystal panel having a conventional structure is preferably used. Accordingly, a description of the structure and the like of the liquid crystal panel 2 is omitted. Installed on one of the longer edges of the liquid crystal panel 2 are TABs (Tape Automated Bonding) 21a on respective surfaces of which source driver ICs 22a are mounted. In addition, installed on one of the shorter edges of the liquid crystal panel 2 are TABs 21b on respective surfaces of which gate driver ICs 22b are mounted. On surfaces of the source driver ICs 22a mounted on the TABs 21a, ceramic or ceramic-containing layers (not shown) are formed. In addition, on surfaces of the TABs 21a opposite to the surfaces on which the source driver ICs 22a are mounted, ceramic or ceramic-containing layers (not shown) are formed at portions corresponding to places on the TABs 21a at which the source driver ICs 22a are mounted. For the ceramic or ceramic-containing layers, the same ones as formed on the surface of the frame 15 or the bezel 16 can be used.

A printed circuit board 23a, on which electronic components that control the source driver ICs 22a are mounted, is connected to the TABs 21a. A printed circuit board 23b, on which electronic components that control the gate driver ICs 22b are mounted, is connected to the TABs 21b.

The inverter circuit board 31 is a printed circuit board in which an inverter circuit that generates the high pulse voltage which is sent to the lamps 12 is included. On the inverter circuit board 31, necessary electronic or electrical components such as a primary side transistor (not shown) of the inverter circuit are mounted. In addition, the control circuit board 32 is a printed circuit board in which a control circuit that controls the source driver ICs 22a and the gate driver ICs 22b is included. On the control circuit board 32, necessary electronic or electrical components such as a control IC (not shown) that controls the source driver ICs 22a and the gate driver ICs 22b are mounted. In the electronic or electrical components mounted on the printed circuit boards 31 and 32, at least on a surface of the primary side transistor mounted on the inverter circuit board 31 and a surface of the control IC mounted on the control circuit board 32, ceramic or ceramic-containing layers (not shown) are formed. For the ceramic or ceramic-containing layers, the same ones as formed on the surface of the frame 15 or the bezel 16 can be used.

The inverter circuit board cover 41 and the control circuit board cover 42 are covering elements arranged to cover the inverter circuit board 31 and the control circuit board 32 respectively, and are preferably made of a metal plate material. On inner surfaces and outer surfaces of the circuit board covers 41 and 42, ceramic or ceramic-containing layers (not shown) are formed. For the ceramic or ceramic-containing layers, the same ones as formed on the surface of the frame 15 or the bezel 16 can be used.

The structure for assembling the display device including the above-described members will be described.

The reflection sheet 18 is laid on a front surface of the backlight chassis 11, and the lamps 12 are placed on a front surface of the reflection sheet 18. The side holders 14 are attached thereto so as to be in alignment with the shorter edges of the backlight chassis 11 and to cover portions close to the ends of the lamps 12. The optical sheets 13 are placed on front surfaces of the backlight angle 11 and the side holders 14, and the frame 15 is attached thereto.

Then, the liquid crystal panel 2 is placed on a front surface of the frame 15. The TABs 21a and 21b, on which the source driver ICs 22a and the gate driver ICs 22b are respectively mounted, are bent toward the back side so as to be in line with the side wall 151, so that the printed circuit boards 23a and 23b connected to the TABs 21a and 21b are attached to the outer surface of the side wall 151. Then, the bezel 16 is attached thereto. Here, the assembling is made so that the longer edge of the liquid crystal panel 2, on which the TABs 21a with the source driver ICs 22a mounted thereon are installed, is in alignment with the longer edges of the frame 15 and the bezel 16 on which the ceramic or ceramic-containing layers are formed.

In addition, the inverter circuit board 31 and the control circuit board 32 are installed on a back surface of the backlight chassis 11, and the inverter circuit board cover 41 and the control circuit board cover 42 are attached thereto so as to cover the inverter circuit board 31 and the control circuit board 32 respectively.

Basic operations of the display device 1 having the configuration as described above will be described. The high pulse voltage generated in the inverter circuit board 31 is sent to the lamps 12, so that the lamps 12 emit light. The light emitted from the lamps 12 goes directly to the optical sheets 13 or is reflected diffusely by the reflection sheet 18 to go to the optical sheets 13. The light is transmitted through the optical sheets 13, so that the properties of the light are controlled by the optical sheets 13. The light of which the properties have been controlled is transmitted through the liquid crystal panel 2. Control signals are sent from the control circuit board 32 to the source driver ICs 22a and the gate driver ICs 22b so as to operate a thin film transistor disposed on the liquid crystal panel 2. Thus, an image is displayed visible on a front side of the liquid crystal panel 2.

A mechanism of cooling the electronic or electrical components of the display device 1 having the configuration as described above will be described.

Figure 2:
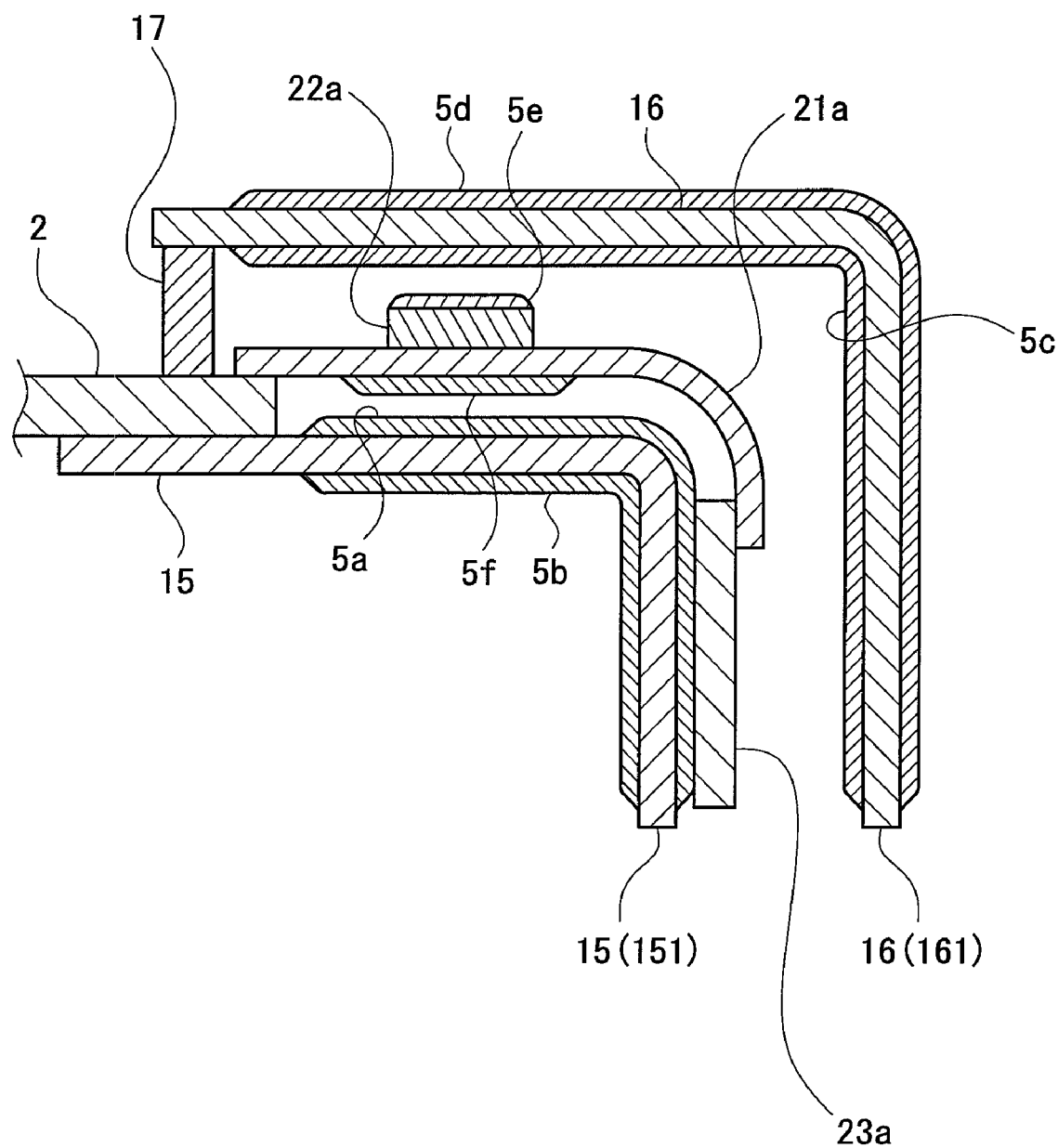
FIG. 2 is a partial sectional view schematically illustrating an inner structure of the display device according to a preferred embodiment of the present invention, specifically, a state of assembling a liquid crystal panel, TABs and a printed circuit board.

FIG. 2 is a partial sectional view schematically illustrating an inner structure of the display device 1 assembled as described above. Specifically, FIG. 2 is a sectional enlarged view schematically illustrating the longer edge in a peripheral portion of the liquid crystal panel 2, the TAB 21a on which the source driver IC 22a is mounted, the printed circuit board 23a connected to the TAB 21a, and their proximity area. As shown in FIG. 2, the peripheral portion of the liquid crystal panel 2 is interposed between the frame 15 and the bezel 16 via a cushioning material 17 (for example, a urethane resin). The TAB 21a on which the source driver IC 22a is mounted is bent toward the back side with the use of its flexibility, and the printed circuit board 23a connected to the TAB 21a is attached to the outer surface of the side wall 151.

Thus, the source driver IC 22a mounted on the TAB 21a faces the back surface of the bezel 16 or the inner surface of the side wall 161. As a result, a ceramic or ceramic-containing layer 5e formed on an outer surface of the source driver IC 22a faces a ceramic or ceramic-containing layer 5c formed on the back surface of the bezel 16 and on the inner surface of the side wall 161.

On a surface of the TAB 21a opposite to a surface on which the source driver IC 22a is mounted, a ceramic or ceramic-containing layer 5f is formed at a portion corresponding to a location at which the source driver IC 22a is mounted. As a result, the ceramic or ceramic-containing layer 5f faces a ceramic or ceramic-containing layer 5a formed on the front surface of the frame 15 and on the outer surface of the side wall 151.

According to such a configuration, heat generated by the source driver IC 22a is radiated from the ceramic or ceramic containing layers 5e and 5f formed on the surface of the source driver IC 22a and the back surface of the TAB 21a. The radiated heat is absorbed by the ceramic or ceramic-containing layer 5c which is formed on the back surface of the bezel 16 and on the inner surface of the side wall 161 and faces the ceramic or ceramic-containing layer 5e, and the ceramic or ceramic-containing layer 5a which is formed on the front surface of the frame 15 and on the outer surface of the side wall 151 and faces the ceramic or ceramic-containing layer 5f. The heat absorbed by the ceramic or ceramic-containing layers 5c and 5a is radiated into the air respectively through a ceramic or ceramic-containing layer 5d formed on the front surface of the bezel 16 and on the outer surface of the side wall 161 and a ceramic or ceramic-containing layer 5b formed on the back surface of the frame 15 and on the inner surface of the side wall 151.

In this way, there are provided a path of heat flow to the outside (into the air) through the ceramic or ceramic-containing layer 5e formed on the surface of the source driver IC 22a, the ceramic or ceramic containing layer 5c formed on the back surface of the bezel 16 and on the inner surface of the side wall 161, the bezel 16, and the ceramic or ceramic-containing layer 5d formed on the front surface of the bezel 16 and on the outer surface of the side wall 161, or a path of heat flow to the outside through the ceramic or ceramic-containing layer 5f formed on the back surface of the TAB 21a, the ceramic or ceramic-containing layer 5a formed on the front surface of the frame 15 and on the outer surface of the side wall 151, the frame 15, and the ceramic or ceramic-containing layer 5b formed on the back surface of the frame 15 and on the inner surface of the side wall 151. Therefore, the heat generated by the source driver IC 22a can be efficiently diffused into the air to promote cooling.

The source driver IC 22a is interposed between the frame 15 and the bezel 16 made of a metallic material, so that electrostatic shielding by the frame 15 and the bezel 16 is achieved. In addition, the heat generated by the source driver IC 22a is diffused by the ceramic or ceramic-containing layers 5a to 5d formed on the surfaces of the frame 15 and the bezel 16 as mentioned above. Thus, electrostatic shielding the source driver IC 22a is achieved while cooling can be performed effectively.

Figure 3:
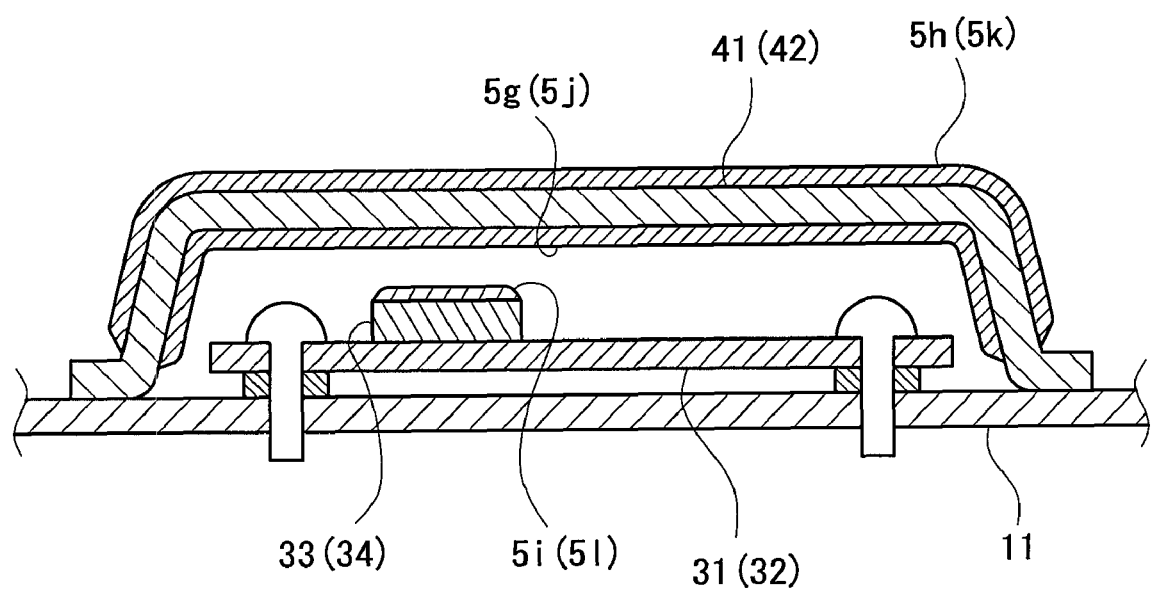
FIG. 3 is a partial sectional view schematically illustrating the inner structure of the display device according to a preferred embodiment of the present invention, specifically, a state where an inverter circuit board or a control circuit board is attached with an inverter circuit board cover or a control circuit board cover.

FIG. 3 is a partial sectional view schematically illustrating the inner structure of the display device 1. Specifically, FIG. 3 is a partial sectional view schematically illustrating a structure of assembling the inverter circuit board 31 or the control circuit board 32 installed on the back surface of the backlight chassis 11, and the inverter circuit board cover 41 or the control circuit board 32. In FIG. 3, reference numerals outside parentheses are applied to the inverter circuit board 31, and reference numerals in parentheses are applied to the control circuit board 32. As shown in FIG. 3, the inverter circuit board 31 is installed on the back surface of the backlight chassis 11, and the inverter circuit board cover 41 is attached thereto so as to cover the inverter circuit board 31. On a surface of a primary side transistor 33 of the inverter circuit mounted on the inverter circuit board 31 and on inner and outer surfaces of the inverter circuit board cover 41, ceramic or ceramic-containing layers 5i, 5g and 5h are formed. Accordingly, the ceramic or ceramic-containing layer 5i formed on the surface of the primary transistor 33 of the inverter circuit faces the ceramic or ceramic-containing layer 5g formed on the inner surface of the inverter circuit board cover 41.

The control circuit board 32 is also assembled as mentioned above. As shown in FIG. 3, the control circuit board 32 is installed on the back surface of the backlight chassis 11, and the control circuit board cover 42 is attached thereto so as to cover the control circuit board 32. On a surface of a control IC 34 mounted on the control circuit board 32 and on inner and outer surfaces of the control circuit board cover 42, ceramic or ceramic-containing layers 5l, 5j and 5k are formed. Accordingly, the ceramic or ceramic-containing layer 5l formed on the surface of the control IC 34 faces the ceramic or ceramic-containing layer 5j formed on the inner surface of the control circuit board cover 42.

According to the configuration as described above, heat generated by the primary side transistor 33 or the control IC 34 is radiated from the ceramic or ceramic-containing layer 5i or 5l formed on the surface of the primary side transistor 33 or the control IC 34. The radiated heat is absorbed by the ceramic or ceramic-containing layer 5g or 5j formed on the inner surface of the circuit board cover 41 or 42. The absorbed heat is radiated from the ceramic or ceramic-containing layer 5h or 5k formed on the outer surface of the circuit board cover 41 or 42 so as to be diffused into the air.

Accordingly, there is provided a path of heat flow to the outside (into the air) through the ceramic or ceramic-containing layer 5i formed on the surface of the primary side transistor 33 of the inverter circuit, the ceramic or ceramic-containing layer 5g formed on the inner surface of the inverter circuit board cover 41, the inverter circuit board cover 41, and the ceramic or ceramic-containing layer 5h formed on the outer surface of the inverter circuit board cover 41. In addition, there is provided a path of heat flow to the outside (into the air) through the ceramic or ceramic-containing layer 5l formed on the surface of the control IC 34, the ceramic or ceramic-containing layer 5j formed on the inner surface of the control circuit board cover 42, the control circuit board cover 42, and the ceramic or ceramic-containing layer 5k formed on the outer surface of the control circuit board cover 42. Therefore, the heat generated by the primary side transistor 33 and the control IC 34 can be efficiently released to the outside to promote cooling.

Since the circuit board 31 or 32 is surrounded by the backlight chassis 11 and the circuit board cover 41 or 42 made of a metallic material, electrostatic shielding, electromagnetic shielding and physical protection can be achieved. In addition, the electronic or electrical components mounted on the circuit boards 31 and 32, especially, the primary side transistor 33 and the control IC 34 are cooled while the heat generated by themselves is effectively released to the outside. Therefore, electrostatic shielding and electromagnetic shielding are achieved while the electronic or electrical components can be effectively cooled.

As mentioned above, there are six portions on which the ceramic or ceramic-containing layer is formed: (1) a surface of an electronic or electrical component which is a subject of cooling; (2) in the case of mounting the electronic or electrical component which is a subject of cooling on a surface of a printed circuit board or a film, a surface of the printed circuit board or the film opposite to the surface on which the electronic or electrical component is mounted; (3) a surface of a member placed in proximity to the electronic or electrical component, which faces (1); (4) in the case of mounting the electronic or electrical component which is a subject of cooling on the printed circuit board or the film, a surface of a member placed in proximity to the printed circuit board or the film, which faces (2); (5) a surface of the member placed in proximity to the electronic or electrical component, which is opposite to (3); and (6) in the case of mounting the electronic or electrical component which is a subject of cooling on the printed circuit board or the film, a surface of the member placed in proximity to the printed circuit board or the film, which is opposite to (4). Practically, the ceramic or ceramic-containing layer may be formed on all of the six portions or may be formed on only some of them. The number of portions may be appropriately determined in consideration of the quantity of heat, the efficiency in cooling, or the like.

In the above-mentioned portions, the ceramic or ceramic-containing layer is preferably formed on an area as described below. For the portion of (2), the ceramic or ceramic-containing layer is preferably formed on an area corresponding at least to a place at which the electronic or electrical component is mounted. For the portion of (3), the ceramic or ceramic-containing layer is preferably formed on an area facing at least the electronic or electrical component. For the portion of (4), the ceramic or ceramic-containing layer is preferably formed on an area facing at least a place on the printed circuit board or the film at which the electronic or electrical component is mounted, and when the ceramic or ceramic-containing layer is formed on the printed circuit board or the film, the ceramic or ceramic-containing layer is preferably formed on an area facing that layer. For the portion of (5), when the ceramic or ceramic-containing layer is formed on the surface of the member facing the electronic or electrical component, the ceramic or ceramic-containing layer is preferably formed on an area on the opposite side of the member which corresponds at least to the area of that layer. For the portion of (6), the ceramic or ceramic-containing layer is preferably formed on an area facing at least the place on the printed circuit board or the film at which the electronic or electrical component is mounted, and when the ceramic or ceramic-containing layer is formed on the printed circuit board or the film, the ceramic or ceramic-containing layer is preferably formed on an area which corresponds to that layer.

In the preferred embodiment described above, the ceramic or ceramic-containing layer preferably is formed almost all over the front surface at the longer edge of the frame 15 and over almost all of the outer surface of the side wall 151 provided at the longer edge of the frame 15 to which the printed circuit board 23a is attached, over almost all of the back surface at the longer edge of the bezel 16 in alignment with the longer edge of the frame 15 and over almost all of the inner surface of the side wall 161 provided at the longer edge of the bezel 16, and over almost all of the inner and outer surfaces of the inverter circuit board cover 41 and the control circuit board cover 42. However, the portions and areas on which the ceramic or ceramic-containing layer is formed are not limited thereto.

As for the portions on which the ceramic or ceramic-containing layer is formed, the ceramic or ceramic-containing layer adapted to cool the source driver IC 22a may be formed only on the back surface of the bezel 16, the inner surface of the side wall 161 and the outer surface of the side wall 151, and not on the front surface of the frame 15. In addition, the ceramic or ceramic-containing layer adapted to cool the primary side transistor 33 of the inverter circuit or the control IC 34 is not necessarily formed on both the surfaces of the circuit board cover 41 or 42, and may be formed only on the inner surface of the circuit board cover 41 or 42 and not to the outer surface thereof in order to absorb the heat generated by the primary side transistor 33 of the inverter circuit or the control IC 34.

As for the areas on which the ceramic or ceramic-containing layer is formed, it is essential only that on the back surface of the bezel 16 or the inner surface of the side wall 161, the ceramic or ceramic-containing layer is formed on the area facing at least the source driver IC 22a. Since the ceramic or ceramic-containing layer 5c formed on the back surface of the bezel 16 and on the inner surface of the side wall 161 is arranged to absorb the radiated heat generated by the source driver IC 22a, it is enough if the ceramic or ceramic-containing layer 5c is formed on the area subject to the radiated heat. In addition, it is essential only that on the front surface of the bezel 16 and the outer surface of the side wall 161, the ceramic or ceramic-containing layer is formed on the area corresponding at least to the area on the back surface of the bezel 16 and on the inner surface of the side wall 161, on which the ceramic or ceramic-containing layer 5c is formed. This is because the ceramic or ceramic-containing layer formed on the front surface of the bezel 16 and on the outer surface of the sidewall 161 is arranged to release the heat absorbed by the ceramic or ceramic-containing layer formed on the back surface of the bezel 16 and on the inner surface of the side wall 161 to the outside.

It is essential only that on the front surface of the frame 15 and the outer surface of the side wall 151, the ceramic or ceramic-containing layer is formed on the area facing at least the ceramic or ceramic-containing layer 5f formed on the surface of the TAB 21a. It is essential only that on the back surface of the frame 15 and on the inner surface of the side wall 151, the ceramic or ceramic-containing layer is formed on the area corresponding at least to the area on the front surface of the frame 15 and on the outer surface of the side wall 151, on which the ceramic or ceramic-containing layer 5a is formed. The ceramic or ceramic-containing layer is formed on such areas for the same reasons as the bezel 16.

It is essential only that on the inner surfaces of the circuit board covers 41 and 42, the ceramic or ceramic-containing layers are formed respectively on the areas facing at least the primary side transistor 33 of the inverter circuit and the control IC 34. Since the ceramic or ceramic-containing layers 5g and 5j formed on the inner surfaces of the circuit board covers 41 and 42 are arranged to absorb the radiated heat from the primary side transistor 33 of the inverter circuit and the control IC 34, it is enough if the ceramic or ceramic-containing layers are formed on the areas subjected to the radiated heat. It is essential only that on the outer surfaces of the circuit board covers 41 and 42, the ceramic or ceramic-containing layers are formed respectively on the areas corresponding at least to the areas of the ceramic or ceramic-containing layers 5g and 5j formed on the inner surfaces thereof. This is because the ceramic or ceramic-containing layers 5h and 5k formed on the outer surfaces of the circuit board covers 41 and 42 are arranged to release the heat absorbed by the ceramic or ceramic-containing layers 5g and 5j formed on the inner surfaces to the outside.

Figure 4:
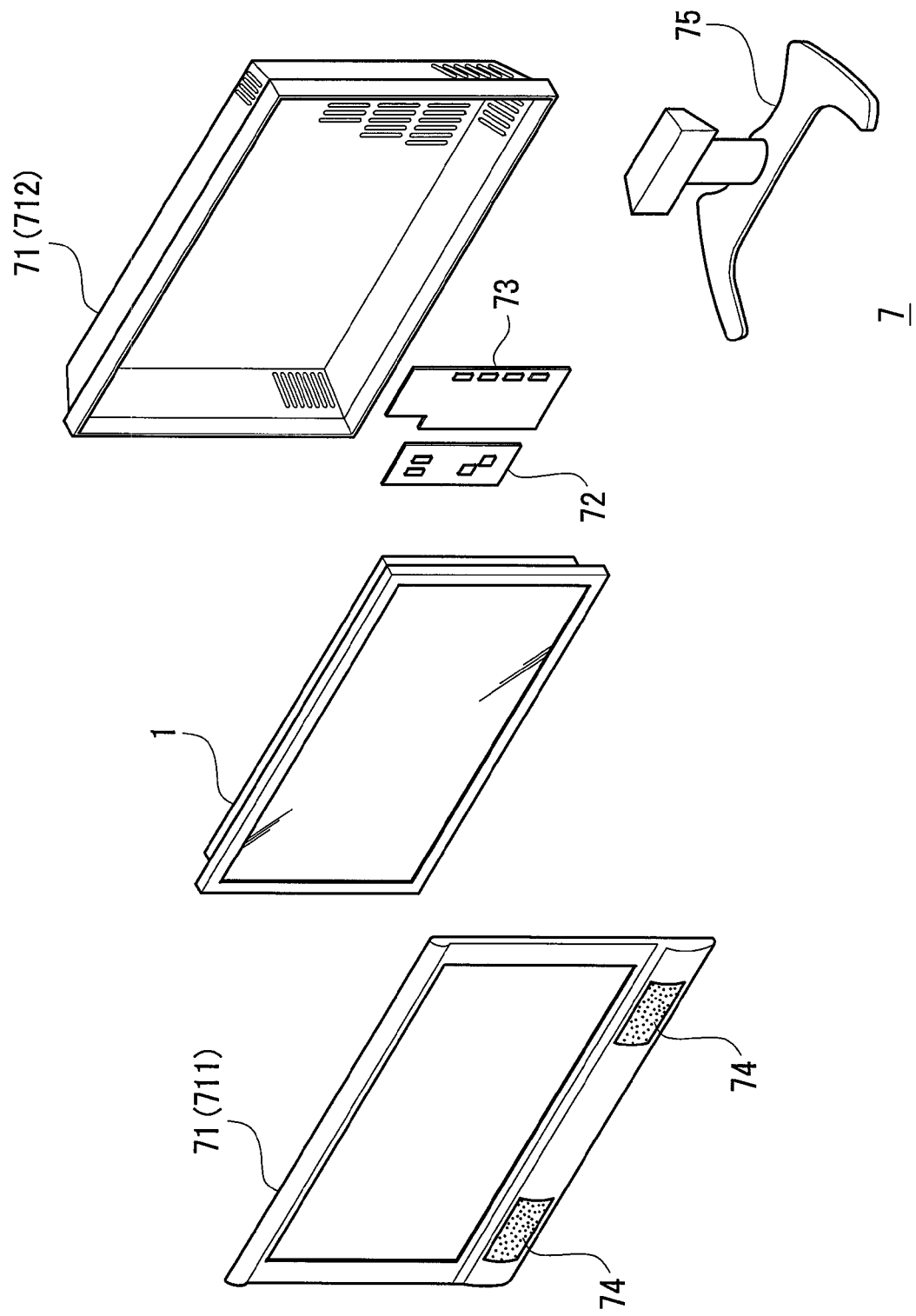
FIG. 4 is an exploded perspective view schematically illustrating a configuration of a television receiver according to a preferred embodiment of the present invention.

Next, a description of a television receiver according to another preferred embodiment of the present invention will be given. FIG. 4 is an exploded perspective view schematically illustrating an example of a configuration of the television receiver according to the present preferred embodiment of the present invention.

A television receiver 7 includes a tuner 72 that produces an image signal and a sound signal of a given channel based on received radio waves or signals inputted from the outside, the display device 1 that displays an image based on the image signal produced by the tuner 72, a loudspeaker mechanism 74 that produces a sound based on the sound signal produced by the tuner 72, and a power supply board 73 that supplies power to the tuner 72, the display device 1 and the loudspeaker mechanism 74.

For the tuner 72, a conventional terrestrial tuner (one or both of analog terrestrial waves and digital terrestrial waves), BS tuner, or CS tuner can be used. For the loudspeaker mechanism 74, a variety of loudspeaker mechanisms such as a generally used loudspeaker can be used. Hence, detailed descriptions thereof are omitted. For the display device 1, the display device according to the preferred embodiment described above can be used.

As shown in FIG. 4, the display device 1, the tuner 72, the loudspeaker mechanism 74 and the power supply board 73 are housed in a cabinet 71. The cabinet 71 in FIG. 4 includes a front side cabinet 711 and a back side cabinet 712. The cabinet 71 is supported by a supporting member 75.

EXAMPLE

A description of Examples according to various preferred embodiments of the present invention will be given.

Advantageous effects of the present invention were examined for the display device according to a preferred embodiment of the present invention. Specifically, surface temperatures at the time of operation of the display device were measured for the source driver IC, the primary side transistor of the inverter circuit, and the control IC.

Table 1 shows a comparison of Examples according to a preferred embodiment of the present invention and Comparative Example. In a configuration of Example 1, a ceramic coating was disposed on the inner surfaces of the bezel facing the source driver IC, the inverter circuit board cover facing the primary side transistor of the inverter circuit, and the control circuit board cover facing the control IC. In a configuration of Example 2, a ceramic coating was disposed on the surfaces of the source driver IC, the primary side transistor of the inverter circuit, and the control IC, and the inner surfaces of the bezel facing the source driver IC, the inverter circuit board cover facing the primary side transistor of the inverter circuit, and the control circuit board cover facing the control IC. In a configuration of the Comparative Example, no ceramic coating was disposed on the surfaces of the source driver IC, the primary side transistor of the inverter circuit and the control IC, and on the portions facing them.

TABLE 1

| Electronic or electrical components | Example 1 | Example 2 | Comparative Example |
| --- | --- | --- | --- |
| Source driver IC | 100° C. | 95° C. | 105° C. |
| Primary side transistor | 95° C. | 90° C. | 100° C. |
| Control IC | 90° C. | 85° C. | 95° C. |
| Evaluation | Good | Excellent | Not good |

The configuration of Example 1 mentioned above is a configuration in which ceramic coating is disposed on portions of members placed in proximity to electronic or electrical components that generate heat, the portions facing the electronic or electrical components, so that the heat generated by the electronic or electrical components is absorbed by the ceramic coating layer. In the configuration of Example 1, the surface temperature of the source driver IC was about 100° C., the surface temperature of the primary side transistor of the inverter circuit was about 95° C., and the surface temperature of the control IC was about 90° C. In the configuration of the Comparative Example, the surface temperature of the source driver IC was 105° C., the surface temperature of the primary side transistor of the inverter circuit was 100° C., and the surface temperature of the control IC was 95° C. The surface temperatures of Example 1 were respectively lower than the surface temperatures of the Comparative Example by about 5° C. Since it is preferable that the electronic or electrical components are maintained at temperatures lower than 100° C., the configuration of Example 1 is suitable for cooling the electronic or electrical components. The ceramic coating, which is made on the portions facing the electronic or electrical components that generate heat, absorbs the heat radiated from the electronic or electrical components, so that the temperatures of the electronic or electrical components can be lowered.

The configuration of Example 2 mentioned above is a configuration in which the ceramic coating is disposed on surfaces of electronic or electrical components that generate heat and on portions of members placed in proximity to the electronic or electrical components, the portions facing the electronic or electrical components, so that the heat is radiated from the ceramic coating layer formed on the surfaces of the electronic or electrical components, and the heat is absorbed by the ceramic coating layer facing that ceramic coating layer. In the configuration of Example 2, the surface temperature of the source driver IC was about 95° C., the surface temperature of the primary side transistor of the inverter circuit was about 90° C., and the surface temperature of the control IC was about 85° C. The surface temperatures of Example 1 were respectively lower than the surface temperatures of Comparative Example by about 10° C. According to the configuration of Example 2, the electronic or electrical components are maintained at temperatures lower than 100° C. Therefore, the configuration of Example 2 is suitable for cooling the electronic or electrical components. It is considered that the formation of the ceramic or ceramic-containing layer on the surfaces of the electronic or electrical components and the ceramic or ceramic-containing layer on the portions facing the electronic or electrical components allows heat to be given and received between the facing ceramic or ceramic-containing layers, so that the electronic or electrical components are cooled sufficiently.

In the above-mentioned preferred embodiments, the source driver IC, the primary side transistor of the inverter circuit, and the control IC are described as the electronic or electrical components which are subjects of cooling. However, the present invention is not limited thereto, and a variety of electronic or electrical components may be cited.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A display device comprising:
   a circuit board comprising:
      a first surface; and
      a second surface that is arranged on an opposite side of the circuit board from the first surface;
   an electronic or electrical component that is mounted on the first surface of the circuit board;
   a first member that is placed in proximity to the electronic or electrical component, the first member including a first surface arranged to face the electronic or electrical component and a second surface arranged on an opposite side of the first member from the first surface of the first member;
   a second member that is placed in proximity to the electronic or electrical component, the second member including a first surface arranged to face the second surface of the circuit board and a second surface arranged on an opposite side of the second member from the first surface of the second member;
   a first ceramic or ceramic-containing layer that is disposed on the first surface of the first member, the first ceramic or ceramic-containing layer being arranged to absorb heat generated by the electronic or electrical component;
   a second ceramic or ceramic-containing layer that is disposed on the second surface of the circuit board, the second ceramic or ceramic-containing layer being arranged to release heat generated by the electronic or electrical component; and
   third ceramic or ceramic-containing layer that is disposed on the first surface of the second member, the third ceramic or ceramic-containing layer being arranged to absorb the heat released from the second ceramic or ceramic-containing layer.

2. The display device according to claim 1, wherein the first member is a conductor.

3. The display device according to claim 2, wherein the conductor is metal.

4. The display device according to claim 1, wherein the first member is a control circuit board cover of a display element.

5. The display device according to claim 1, wherein the first member is a power supply board cover.

6. The display device according to claim 1, wherein the first member is a mechanical supporting member.

7. A television receiver comprising the display device according to claim 1.

8. The display device according to claim 1, further comprising:
   a fourth ceramic or ceramic-containing layer that is disposed on the second surface of the first member, the fourth ceramic or ceramic-containing layer being arranged to release the heat absorbed by the first ceramic or ceramic-containing layer; and
   a fifth ceramic or ceramic-containing layer that is disposed on the second surface of the second member, the fifth ceramic or ceramic-containing layer being arranged to release the heat absorbed by the third ceramic or ceramic-containing layer.

* * * * *